United States Patent [19]
Yu et al.

[11] Patent Number: 5,869,384
[45] Date of Patent: Feb. 9, 1999

[54] TRENCH FILLING METHOD EMPLOYING SILICON LINER LAYER AND GAP FILLING SILICON OXIDE TRENCH FILL LAYER

[75] Inventors: Chen-Hua Yu; Syun-Ming Jang, both of Hsin-Chu; Ying-Ho Chen, Taipei, all of Taiwan

[73] Assignee: Taiwan Semiconductor Manufacturing Company, Ltd., Hsin-Chu, Taiwan

[21] Appl. No.: 820,467

[22] Filed: Mar. 17, 1997

[51] Int. Cl.$^6$ ................................................. H01L 21/76
[52] U.S. Cl. .................................................... 438/431
[58] Field of Search .................. 438/431, 227; 427/96

[56] References Cited

U.S. PATENT DOCUMENTS

| | | |
|---|---|---|
| 4,666,556 | 5/1987 | Fulton et al. . |
| 5,346,584 | 9/1994 | Nasr et al. ............................. 156/636 |
| 5,416,041 | 5/1995 | Schwalke et al. . |
| 5,472,904 | 12/1995 | Figura et al. ............................ 437/67 |
| 5,492,858 | 2/1996 | Bose et al. ............................... 437/67 |

FOREIGN PATENT DOCUMENTS

| | | |
|---|---|---|
| 61-67933 | 4/1986 | Japan . |
| 61-168241 | 7/1986 | Japan . |

Primary Examiner—George R. Fourson
Attorney, Agent, or Firm—George O. Saile; Stephen B. Ackerman; Alek P. Szecsy

[57] ABSTRACT

A method for filling a trench within a substrate. There is first provided a substrate having a trench formed within the substrate. There is then formed over the substrate and within the trench a silicon layer. The silicon layer has an aperture formed therein where the silicon layer is formed within the trench. There is then formed upon the silicon layer and filling the aperture a gap filling silicon oxide trench fill layer. The gap filling silicon oxide trench fill layer is formed through an ozone assisted sub-atmospheric pressure chemical vapor deposition (SACVD) method. Finally, the substrate is annealed thermally in an oxygen containing atmosphere to form within the trench an oxidized silicon layer from the silicon layer, where the oxidized silicon layer is contiguous with a densified gap filling silicon oxide trench fill layer simultaneously formed from the gap filling silicon oxide trench fill layer. Through the method, the densified gap filling silicon oxide trench fill layer is formed without a surface sensitivity.

16 Claims, 2 Drawing Sheets

TRENCH FILLING METHOD EMPLOYING SILICON LINER LAYER AND GAP FILLING SILICON OXIDE TRENCH FILL LAYER

BACKGROUND OF THE INVENTION

1. Field of the Invention

The present invention relates generally to methods for forming trench fill layers within trenches within substrates employed in integrated circuit fabrication. More particularly, the present invention relates to methods for forming gap filling ozone assisted chemical vapor deposited (CVD) silicon oxide trench fill layers within trenches within substrates employed in integrated circuit fabrication.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit technology has advanced and integrated circuit device dimensions have decreased, it has become increasingly common within advanced integrated circuits to employ trench isolation methods such as shallow trench isolation (STI) methods and recessed oxide isolation (ROI) methods to form trench isolation regions nominally co-planar with adjoining active semiconductor regions of semiconductor substrates. Such trench isolation methods typically employ a chemical mechanical polish (CMP) planarizing method to provide a nominally planarized surface to a trench isolation region formed from a trench fill dielectric layer formed within the trench. Trench isolation regions nominally co-planar with active semiconductor regions within semiconductor substrates are desirable since they optimize, when subsequently forming patterned layers upon those nominally co-planar trench isolation regions and active semiconductor regions, the limited depth of focus typically achievable with advanced photoexposure tooling.

When forming within advanced integrated circuits trench isolation regions within isolation trenches, it has become common to employ as trench fill dielectric layers gap filling silicon oxide layers formed through ozone assisted sub-atmospheric pressure chemical vapor deposition (SACVD) methods and ozone assisted atmospheric pressure chemical vapor deposition (APCVD) methods. Silicon oxide layers formed through such methods are desirable since such silicon oxide layers possess inherently superior gap filling characteristics desirable for trenches of limited dimensions typically encountered in advanced integrated circuit fabrication.

While gap filling silicon oxide layers formed through ozone assisted sub-atmospheric pressure chemical vapor deposition (SACVD) methods and ozone assisted atmospheric pressure chemical vapor deposition (APCVD) methods are thus desirable as trench fill layers within trenches within advanced integrated circuit fabrication, methods through which are formed such gap filling silicon oxide layers are not entirely without problems. In particular, it is known in the art that gap filling silicon oxide layers formed through ozone assisted sub-atmospheric pressure chemical vapor deposition (SACVD) methods exhibit a surface sensitivity dependent upon the substrate layers upon which are formed those gap filling silicon oxide layers. In particular, when employing as substrate layers thermally grown silicon oxide layers which are typically employed as isolation trench liner layers within isolation trenches formed within semiconductor substrates, gap filling silicon oxide layers formed through ozone assisted sub-atmospheric pressure chemical vapor deposition (SACVD) methods exhibit inhibited formation rates. Inhibited formation rates within isolation trenches within semiconductor substrates of gap filling silicon oxide trench fill layers formed through ozone assisted sub-atmospheric pressure chemical vapor deposition (SACVD) methods are undesirable since there is then formed within those isolation trenches gap filling silicon oxide trench fill layers which are particularly susceptible to dishing when subsequently planarized through chemical mechanical polish (CMP) planarizing methods.

It is thus towards the goal of forming within advanced integrated circuits gap filling silicon oxide trench fill layers formed through ozone assisted sub-atmospheric pressure chemical vapor deposition (SACVD) methods, while avoiding a surface sensitivity, that the present invention is generally directed.

Methods and materials through which isolation regions may be formed within isolation trenches for use within integrated circuits are known in the art of integrated circuit fabrication. For example, Nasr et al., in U.S. Pat. No. 5,346,584 disclose a planarization method employing an oxidized patterned polysilicon filler layer as a trench fill layer when forming an isolation region within an isolation trench within a semiconductor substrate. The oxidized patterned polysilicon filler layer provides a relatively planar semiconductor substrate surface which is readily planarized through a chemical mechanical polish (CMP) planarizing method. In addition, Figura et al., in U.S. Pat. No. 5,472,904 disclose a method for simultaneously forming a narrow trench isolation region and a recessed oxide isolation (ROI) region within a semiconductor substrate. The method employs an oxidation barrier formed within a narrow trench within which is formed the narrow trench isolation region, but not within a wide trench within which is formed the recessed oxide isolation region. Finally, Bose et al., in U.S. Pat. No. 5,492,858 disclose a method for forming a planarized trench fill dielectric layer within an isolation trench within an integrated circuit. The method employs within the isolation trench a barrier layer which allows for densifying, through steam annealing, a conformal silicon oxide trench fill dielectric layer which may then subsequently be planarized, while avoiding dishing, through a chemical mechanical polish (CMP) planarizing method.

Desirable in the art are additional methods through which trenches within substrates employed within integrated circuit fabrication may be filled with gap filling silicon oxide trench fill layers formed through ozone assisted sub-atmospheric pressure chemical vapor deposition (SACVD) methods, while avoiding a surface sensitivity. Particularly desirable are additional methods through which isolation trenches within semiconductor substrates employed within integrated circuit fabrication may be filled with gap filling silicon oxide trench fill dielectric layers formed through ozone assisted sub-atmospheric chemical vapor deposition (SACVD) methods, while avoiding a surface sensitivity. It is towards these goals that the present invention is more specifically directed.

SUMMARY OF THE INVENTION

A first object of the present invention is to provide a method through which a trench within a substrate employed in integrated circuit fabrication may be filled with a gap filling silicon oxide trench fill layer formed through a sub-atmospheric pressure chemical vapor deposition (SACVD) method.

A second object of the present invention is to provide a method in accord with the first object of the present invention, where there is avoided a surface sensitivity when forming the gap filling silicon oxide trench fill layer.

A third object of the present invention is to provide a method in accord with the first object of the present invention and the second object of the present invention, where the substrate is a semiconductor substrate and the trench is an isolation trench.

A fourth object of the present invention is to provide a method in accord with the first object of the present invention, the second object of the present invention and the third object of the present invention, which method is readily manufacturable.

In accord with the objects of the present invention, there is provided a method for forming within a trench within a substrate employed in integrated circuit fabrication a gap filling silicon oxide trench fill layer. To practice the method of the present invention, there is first provided a substrate having a trench formed within the substrate. There is then formed over the substrate and within the trench a silicon layer. The silicon layer has an aperture formed therein where the silicon layer is formed within the trench. There is then formed upon the silicon layer and filling the aperture a gap filling silicon oxide trench fill layer. The gap filling silicon oxide trench fill layer is formed through an ozone assisted sub-atmospheric pressure chemical vapor deposition (SACVD) method. Finally, the substrate is thermally annealed in an oxygen containing atmosphere to form within the trench a thermally oxidized silicon layer from the silicon layer, where the thermally oxidized silicon layer is contiguous with a densified gap filling silicon oxide trench fill layer simultaneously formed through thermal annealing the gap filling silicon oxide trench fill layer.

The present invention provides a method through which there may be formed within a trench within a substrate employed in integrated circuit fabrication a gap filling silicon oxide trench fill layer formed through a sub-atmospheric pressure chemical vapor deposition (SACVD) method, where there is avoided a surface sensitivity when forming the gap filling silicon oxide trench fill layer. By forming through the method of the present invention the gap filling silicon oxide trench fill layer upon a silicon layer formed within the trench, rather than forming the gap filling silicon oxide trench fill layer upon a thermally grown silicon oxide trench liner layer formed within the trench, there is avoided a surface sensitivity when forming the gap filling silicon oxide trench fill layer through the sub-atmospheric pressure chemical vapor deposition (SACVD) method.

The method of the present invention may be practiced where the substrate is a semiconductor substrate and where the trench is an isolation trench within the semiconductor substrate. The method of the present invention does not discriminate with respect to the nature of the substrate and the nature of the trench formed within the substrate, since within the method of the present invention a surface sensitivity of the gap filling silicon oxide trench fill layer formed through the sub-atmospheric pressure chemical vapor deposition (SACVD) method is influenced by the silicon layer formed beneath the gap filling silicon oxide trench fill layer. Thus, the method of the present invention may successfully be practiced when the substrate is a semiconductor substrate and the trench is an isolation trench formed within the semiconductor substrate.

The method of the present invention is readily manufacturable. The method of the present invention employs a thermal annealing method in an oxygen containing atmosphere for forming within a trench within a substrate employed in integrated circuit fabrication a thermally oxidized silicon layer from a silicon layer, where the thermally oxidized silicon layer is contiguous with a densified gap filling silicon oxide trench fill layer formed simultaneously through the thermal annealing method from a gap filling silicon oxide trench fill layer formed through a sub-atmospheric pressure chemical vapor deposition (SACVD) method. Since the requisite thermal annealing methods, silicon layer formation methods and gap filling silicon oxide trench fill layer formation methods are generally known in the art of integrated circuit fabrication, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming, while avoiding a surface sensitivity, a planarized gap filling silicon oxide trench fill layer within a trench within a substrate employed within integrated circuit fabrication. To achieve this goal, the method of the present invention provides that there is first formed over the substrate and within the trench a silicon layer, where the silicon layer has an aperture formed therein where the silicon layer is formed within the trench. There is then formed upon the silicon layer and filling the aperture a gap filling silicon oxide trench fill layer. The gap filling silicon oxide trench fill layer is formed through an ozone assisted sub-atmospheric pressure chemical vapor deposition (SACVD) method. The substrate is then thermally annealed in an oxygen containing atmosphere to form within the trench a thermally oxidized silicon layer from the silicon layer, where the thermally oxidized silicon layer is contiguous with a densified gap filling silicon oxide trench fill layer simultaneously formed through thermally annealing the gap filling silicon oxide trench fill layer. The thermally oxidized silicon layer and the densified gap filling silicon oxide trench fill layer may then be planarized through a chemical mechanical polish (CMP) planarizing method to form within the trench a patterned planarized thermally oxidized silicon layer contiguous with a patterned planarized densified gap filling silicon oxide trench fill layer.

Although the preferred embodiment of the method of the present invention illustrates the method of the present invention employed in forming, while avoiding a surface sensitivity, patterned planarized densified gap filling silicon oxide trench fill dielectric layers within isolation trenches within a semiconductor substrate employed in integrated circuit fabrication, the method of the present invention may also be employed in forming, while avoiding a surface sensitivity, the densified gap filling silicon oxide trench fill layer or the patterned planarized densified gap filling silicon oxide trench fill layers of the method of the present invention within trenches other than isolation trenches within substrates other than semiconductor substrates. The method of the present invention may be employed in forming, while avoiding a surface sensitivity, the densified gap filling silicon oxide trench fill layer or the patterned planarized densified gap filling silicon oxide trench fill layers of the present invention into trenches within substrates including but not limited to dielectric substrates, semiconductor substrates and conductor substrates. For a general application of the method of the present invention, the width of the trench into which is formed the gap filling silicon oxide trench fill layer is preferably greater than about 0.3 microns and the depth of the trench is preferably from about 3000 to about 5000 angstroms.

Figure 1:
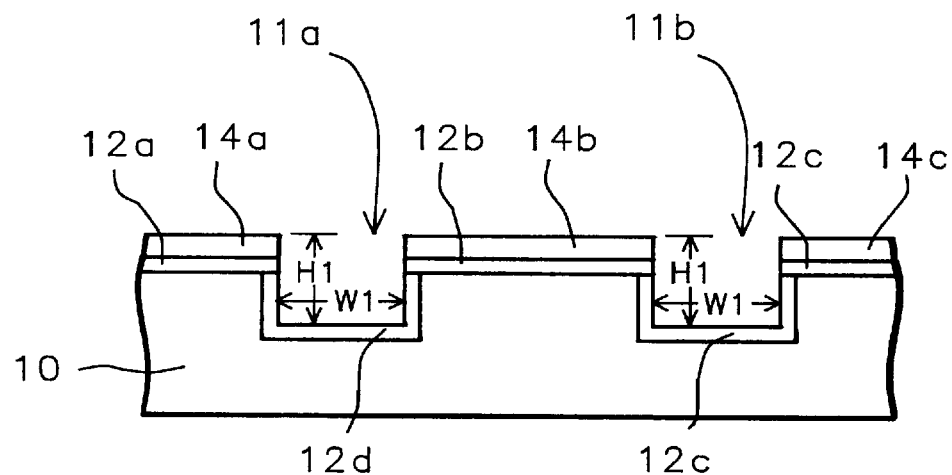
FIG. 1 to FIG. 5 show a series of schematic cross-sectional diagrams illustrating the results of progressive stages in forming within an isolation trench within a semiconductor substrate employed in integrated circuit fabrication a planarized gap filling silicon oxide trench fill dielectric layer formed, while avoiding a surface sensitivity, in accord with a preferred embodiment of the method of the present invention.

Referring now to FIG. 1 to FIG. 5, there is shown a series of schematic cross-sectional diagrams illustrating the results of progressive stages in forming, while avoiding a surface sensitivity, a pair of patterned planarized densified gap filling silicon oxide trench fill dielectric layers within a pair of isolation trenches within a semiconductor substrate in accord with a preferred embodiment of the method of the present invention. Shown in FIG. 1 is a schematic cross-sectional diagram of the semiconductor substrate at an early stage in its fabrication.

Shown in FIG. 1 is a semiconductor substrate 10 having formed therein a pair of isolation trenches 11a and 11b, where a gap filling silicon oxide trench fill dielectric layer is typically formed into the pair of isolation trenches 11a and 11b through a sub-atmospheric pressure chemical vapor deposition (SACVD) method conventional in the art of integrated circuit fabrication and subsequently planarized through a chemical mechanical polish (CMP) planarizing method conventional in the art of integrated circuit fabrication. Although the method of the present invention may be practiced employing semiconductor substrates of either dopant polarity, any dopant concentration and various crystallographic orientations, within the preferred embodiment of the method of the present invention the semiconductor substrate 10 is preferably a (100) silicon semiconductor substrate having an N- or P- doping. As is illustrated in FIG. 1, each of the isolation trenches 11a and 11b within the semiconductor substrate 10 has a width W1 and a height H1, where the width W1 is preferably greater than about 0.3 microns while the height H1 is preferably from about 3000 to about 5000 angstroms.

Formed upon the semiconductor substrate 10 and defining the isolation trenches 11a and 11b is a series of patterned silicon oxide pad oxide layers 12a, 12b and 12c having formed and aligned thereupon a series of patterned silicon nitride layers 14a, 14b and 14c. Within the preferred embodiment of the method of the present invention, the series of patterned silicon nitride layers 14a, 14b and 14c serves as a series of patterned chemical mechanical polish (CMP) polish stop layers, while the series of patterned silicon oxide pad oxide layers 12a, 12b and 12c serves as a series of adhesive forming and stress reducing layers between the semiconductor substrate 10 and the series of patterned silicon nitride layers 14a, 14b and 14c. While the series of patterned silicon oxide pad oxide layers 12a, 12b and 12c, and the series of patterned silicon nitride layers 14a, 14b and 14c, are preferably employed within the preferred embodiment of the method of the present invention, they are not required within the method of the present invention. However, their presence provides a means for most uniformly forming within the isolation trenches 11a and 11b patterned planarized gap filling silicon oxide trench fill dielectric layers through the preferred embodiment of the method of the present invention.

The patterned silicon oxide pad oxide layers 12a, 12b and 12c, and the patterned silicon nitride layers 14a, 14b and 14c may be formed through methods as are conventional in the art, which will typically, although not exclusively, employ photolithographic patterning of a blanket silicon oxide pad oxide layer which is formed beneath a corresponding blanket silicon nitride layer. The blanket silicon nitride layer and the blanket silicon oxide pad oxide layer may similarly be formed through methods as are conventional in the art, including but not limited to thermal oxidation methods, chemical vapor deposition (CVD) methods and physical vapor deposition (PVD) sputtering methods, as are appropriate. Preferably, the patterned silicon oxide pad oxide layers 12a, 12b and 12c, and the corresponding blanket silicon oxide pad oxide layer, are formed to a thickness of from about 90 to about 130 angstroms each, the blanket silicon oxide pad oxide layer preferably being formed through a thermal oxidation method at a temperature of from about 850 to about 950 degrees centigrade. Preferably, the patterned silicon nitride layers 14a, 14b and 14c, and the corresponding blanket silicon nitride layer, are formed to a thickness of from about 1500 to about 1900 angstroms each.

Also shown in FIG. 1 is the presence of a pair of patterned silicon oxide trench liner layers 12d and 12e formed into the corresponding isolation trenches 11a and 11b. Preferably, the patterned silicon oxide trench liner layers 12d and 12e are formed in a self aligned fashion within each isolation trench 11a or 11b through a thermal oxidation method analogous or equivalent to the thermal oxidation method preferably employed in forming the blanket silicon oxide pad oxide layer from which is formed the patterned silicon oxide pad oxide layers 12a, 12b and 12c. Preferably, the patterned silicon oxide trench liner layers 12d and 12e have a thickness of from about 300 to about 500 angstroms each. The patterned silicon oxide trench liner layers 12d and 12e are particularly desirable within advanced integrated circuit fabrication since, when formed through a thermal oxidation method, they provide a superior leakage barrier between the semiconductor substrate 10 and trench fill dielectric layers subsequently formed within the isolation trenches 11a and 11b. Unfortunately, as disclosed within the Description of the Related Art, as above, silicon oxide layers, such as the patterned silicon oxide trench liner layers 12d and 12e, when formed through a thermal oxidation method provide a surface sensitivity manifested as an inhibited formation rate of gap filling silicon oxide layers formed through ozone assisted sub-atmospheric pressure chemical vapor deposition (SACVD) methods upon those silicon oxide layers formed through thermal oxidation methods.

Figure 2:
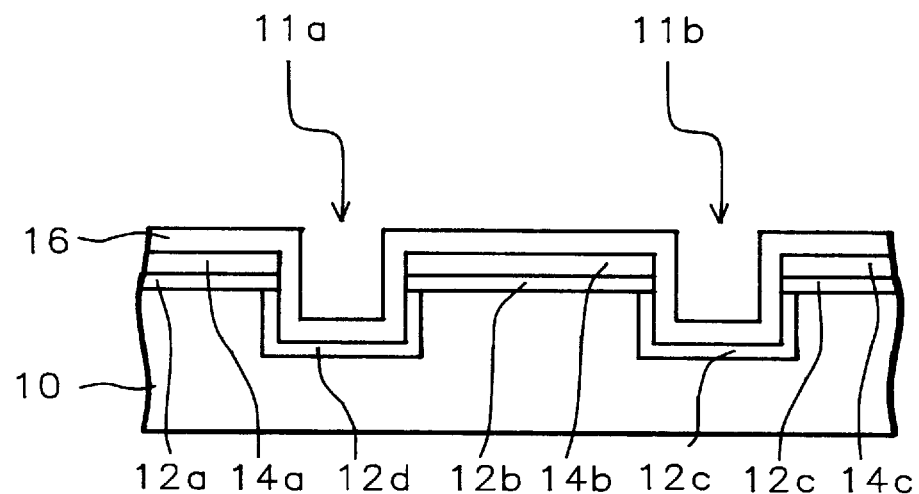

Referring now to FIG. 2, there is shown a schematic cross-sectional diagram illustrating the results of further processing of the semiconductor substrate 10 whose schematic cross-sectional diagram is illustrated in FIG. 1. Shown in FIG. 2 is a schematic cross-sectional diagram of the semiconductor substrate 10 otherwise equivalent to the semiconductor substrate 10 whose schematic cross-sectional diagram is illustrated in FIG. 1, but wherein there is formed over the semiconductor substrate 10 and into the isolation trenches 11a and 11b a silicon layer 16. Preferably, the silicon layer 16 is a conformal silicon layer, thus forming within the silicon layer 16 a pair of apertures where the silicon layer 16 is formed into the pair of isolation trenches 11a and 11b. The silicon layer 16, which is also preferably formed from either a polycrystalline silicon material or an amorphous silicon material, may be formed from any of several methods as are conventional in the art of integrated circuit fabrication, including but not limited to evaporation methods, chemical vapor deposition (CVD) methods and physical vapor deposition (PVD) sputtering methods. Preferably, the silicon layer 16, when formed from either a polycrystalline silicon material or an amorphous silicon material is from about 150 to about 250 angstroms thick.

Figure 3:
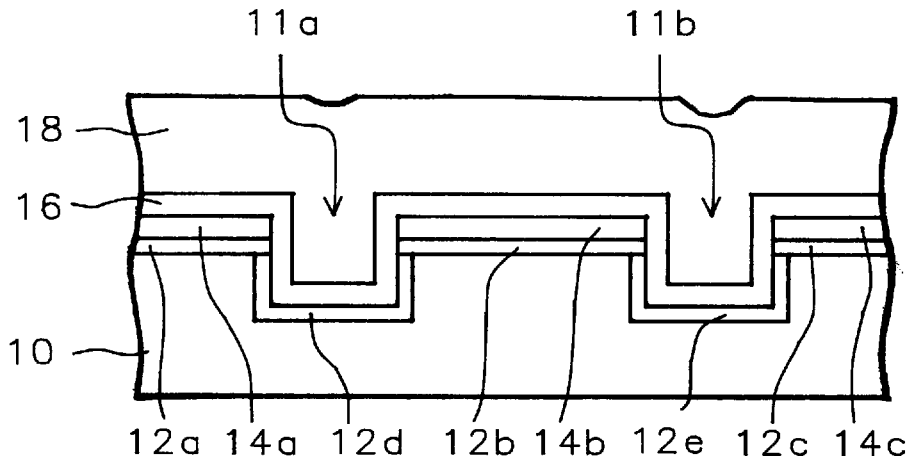

Referring now to FIG. 3, there is shown a schematic cross-sectional diagram illustrating the results of further processing of the semiconductor substrate 10 whose schematic cross-sectional diagram is illustrated in FIG. 2. Shown in FIG. 3 is a schematic cross-sectional diagram of the semiconductor substrate 10 otherwise equivalent to the semiconductor substrate 10 whose schematic cross-sectional diagram is illustrated in FIG. 2, but upon whose surface is formed a gap filling silicon oxide trench fill dielectric layer 18. Within the method of the present invention, the gap filling silicon oxide trench fill dielectric layer 18 is formed through an ozone assisted sub-atmospheric pressure chemical vapor deposition (SACVD) method. Due to the elevated pressures at which ozone assisted sub-atmospheric pressure chemical vapor deposition (SACVD) methods are employed, these methods preclude plasma activation, but nonetheless provide superior gap filling and planarizing properties to gap filling silicon oxide trench fill dielectric layers formed through these methods. Preferably, the ozone assisted sub-atmospheric pressure chemical vapor deposition (SACVD) method employs tetra-ethyl-ortho-silicate (TEOS) as a silicon source material at an ozone:TEOS volume ratio of from about 10:1 to about 15:1.

Other parameters employed in forming the gap filling silicon oxide trench fill dielectric layer 18 include: (1) a reactor chamber pressure of from about 400 to about 600 torr; (2) a substrate temperature of from about 380 to about 440 degrees centigrade; (3) an ozone concentration in an oxygen carrier gas of from about 10 to about 14 weight percent; (4) a tetra-ethyl-ortho-silicate (TEOS) flow rate of from about 30 to about 40 standard cubic centimeters per minute (sccm); (5) an oxygen (ozone carrier gas) flow rate of from about 4000 to about 6000 standard cubic centimeters per minute (sccm); and (6) a helium (tetra-ethyl-ortho-silicate (TEOS) carrier gas) flow rate of from about 2000 to about 2500 standard cubic centimeters per minute (sccm). Preferably, the gap filling silicon oxide trench fill dielectric layer 18 is formed to a thickness of from about 6000 to about 8000 angstroms over the semiconductor substrate 10. As is illustrated in FIG. 3, the gap filling silicon oxide trench fill dielectric layer 18 is formed while avoiding a surface sensitivity since the gap filing silicon oxide trench fill dielectric layer 18 is formed in contact with a single silicon layer rather formed in contact with a plurality of integrated circuit layers which includes a silicon oxide layer formed through a thermal oxidation method.

Figure 4:
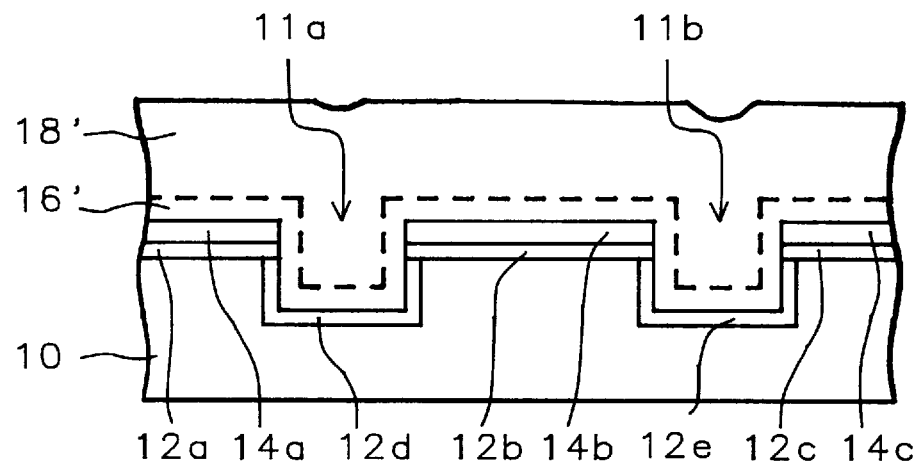

Referring now to FIG. 4, there is shown a schematic cross-sectional diagram illustrating the results of further processing of the semiconductor substrate 10 whose schematic cross-sectional diagram is illustrated in FIG. 3. Shown in FIG. 4 is the results of thermally annealing in an oxygen containing atmosphere the semiconductor substrate 10 whose schematic cross-sectional diagram is illustrated in FIG. 3. When thermally annealing in an oxygen containing atmosphere the semiconductor substrate 10 whose schematic cross-sectional diagram is illustrated in FIG. 3, the silicon layer 16 is oxidized to form a thermally oxidized silicon layer 16' and the gap filling silicon oxide trench fill dielectric layer 18 is densified to form a densified gap filling silicon oxide trench fill dielectric layer 18', where the thermally oxidized silicon layer 16' is contiguous with the densified gap filling silicon oxide trench fill dielectric layer 18'. Typically, the thermally oxidized silicon layer 16' will exhibit substantial expansion with respect to the silicon layer 16 and thus compensate for the densified gap filling silicon oxide trench fill dielectric layer 18' which will typically exhibit some shrinkage with respect to the gap filling silicon oxide trench fill dielectric layer 18. Thus, the thermally oxidized silicon layer 16' contiguous with the densified gap filling silicon oxide trench fill dielectric layer 18' serves also to reduce stress within the semiconductor substrate 10 whose schematic cross-sectional diagram is illustrated in FIG. 4. Preferably, the semiconductor substrate 10 is thermally annealed to form the oxidized silicon layer 16' and the densified gap filling silicon oxide trench fill dielectric layer 18' within the oxygen containing atmosphere employed at: (1) a reactor chamber pressure of about 760 torr; (2) an oxygen concentration of about 100 volume percent; (3) an oxygen flow of from about 8 to about 12 standard liters per minute (slm); and (4) a temperature of from about 1000 to about 1100 degrees centigrade, for a time period of from about 60 to about 120 minutes.

Figure 5:
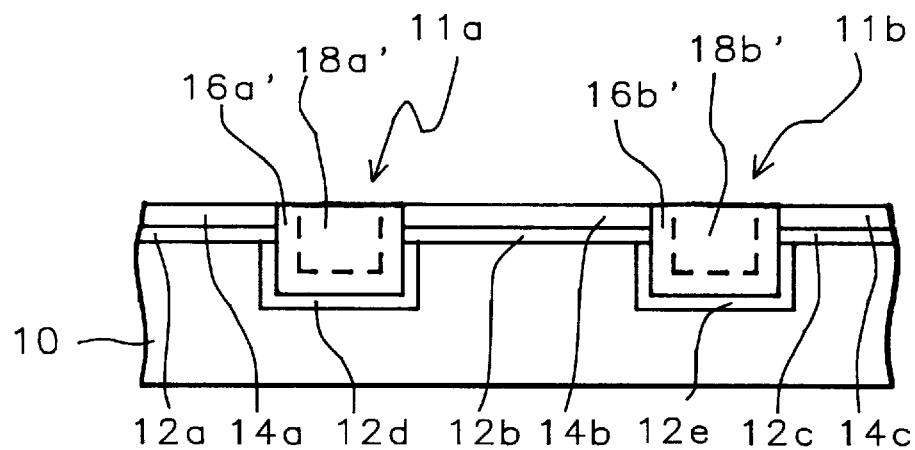

Referring now to FIG. 5, there is shown a schematic cross-sectional diagram illustrating the results of further processing of the semiconductor substrate 10 whose schematic cross-sectional diagram is illustrated in FIG. 4. Shown in FIG. 5 is the results of planarizing through a chemical mechanical polish (CMP) planarizing method the densified gap filling silicon oxide trench fill dielectric layer 18' and the thermally oxidized silicon layer 16' to form within the corresponding isolation trenches 11a and 11b a pair of patterned planarized thermally oxidized silicon layers 16a' and 16b' having formed and aligned thereupon a pair of patterned planarized densified silicon oxide trench fill dielectric layers 18a' and 18b'. Since the densified gap filling silicon oxide trench fill dielectric layer 18' is formed, while avoiding a surface sensitivity, upon the thermally oxidized silicon layer 16', the patterned planarized densified gap filling silicon oxide trench fill dielectric layers 18a' and 18b' are formed, while avoiding a surface sensitivity, upon the patterned planarized thermally oxidized silicon layers 16a' and 16b'.

While any of several parameters may be employed within the chemical mechanical polish (CMP) planarizing method for forming from the densified gap filling silicon oxide trench fill dielectric layer 18' and the thermally oxidized silicon layer 16' the patterned planarized densified gap filling silicon oxide trench fill dielectric layers 18a' and 18b' and the patterned planarized thermally oxidized silicon layers 16a' and 16b', the chemical mechanical polish (CMP) planarizing method employed within the preferred embodiment of the method of the present invention preferably employs: (1) a platen pressure of from about 6 to about 10 pounds per square inch (psi); (2) a platen rotation speed of from about 30 to about 60 revolutions per minute (rpm); (3) a carrier rotation speed of from about 30 to about 60 revolutions per minute (rpm); (4) an aqueous silica slurry comprising about 10 to about 20 weight percent silica, and (5) an aqueous silica slurry flow rate of from about 100 to about 200 standard cubic centimeters per minute (sccm).

EXAMPLES 1–5

A series of five (100) silicon semiconductor substrates was obtained and there was formed upon each of four of the five silicon semiconductor substrates a different integrated circuit layer. The fifth silicon semiconductor substrate had no integrated circuit layer formed thereupon.

Upon the first silicon semiconductor substrate there was formed a silicon oxide layer through a thermal oxidation method employing an oxygen ambient employed at: (1) a reactor chamber pressure of about 760 torr; (2) an oxygen concentration of about 100 volume percent; (3) an oxygen flow rate of about 10 standard liters per minute (slm); and (4) a temperature of about 920 degrees centigrade. The silicon oxide layer formed through the thermal oxidation method was formed to a thickness of about 110 angstroms.

Upon the second silicon semiconductor substrate there was formed a silicon nitride layer through a low pressure chemical vapor deposition (LPCVD) method, without plasma activation, employing silane as a silicon source material and ammonia as a nitrogen source material. The low pressure chemical vapor deposition (LPCVD) method employed: (1) a reactor chamber pressure of about 10 torr; (2) a substrate temperature of about 780 degrees centigrade; (3) a dichlorosilane flow rate of about 0.06 standard liters per minute (slm), and (4) an ammonia flow rate of about 0.6 standard liters per minute (slm), for a deposition time of about 105 minutes. The silicon nitride layer was formed to a thickness of about 1700 angstroms.

Upon the third silicon semiconductor substrate there was formed a polysilicon layer through a low pressure chemical vapor deposition (LPCVD) method employing silane as a silicon source material. The low pressure chemical vapor deposition (LPCVD) method employed: (1) a reactor chamber pressure of about 10 torr; (2) a substrate temperature of about 620 degrees centigrade; and (3) a silane flow rate of about 0.3 standard liters per minute (slm), for a deposition time of about 8 minutes. The polysilicon layer was formed to a thickness of about 200 angstroms.

Upon the fourth silicon semiconductor substrate there was formed an amorphous silicon layer through a low pressure chemical vapor deposition (LPCVD) method employing silane as a silicon source material. The low pressure chemical vapor deposition (LPCVD) method employed: (1) a reactor chamber pressure of about 10 torr; (2) substrate temperature of about 520 degrees centigrade; and (3) a silane flow rate of about 0.1 standard liters per minute (slm). The amorphous silicon layer was formed to a thickness of about 200 angstroms.

Upon each of the five silicon semiconductor substrates was then formed a gap filling silicon oxide layer formed through an ozone assisted sub-atmospheric pressure chemical vapor deposition (CVD) method employing tetra-ethyl-ortho-silicate (TEOS) as a silicon source material at an ozone:TEOS volume ratio of about 13:1. The ozone assisted sub-atmospheric pressure chemical vapor deposition (CVD) method employed: (1) a reactor chamber pressure of about 450 torr (without plasma activation); (2) a substrate temperature of about 400 degrees centigrade; (3) an ozone concentration in an oxygen carrier carrier gas of about 12 weight percent; (4) a tetra-ethyl-ortho-silicate (TEOS) flow rate of about 35 standard cubic centimeters per minute (sccm); (5) an oxygen (ozone carrier gas) flow rate of about 5000 standard cubic centimeters per minute (sccm); and (6) a helium (tetra-ethyl-ortho-silicate (TEOS) carrier gas) flow rate of about 2300 standard cubic centimeters per minute (sccm). The gap filling silicon oxide layers formed through the ozone assisted sub-atmospheric pressure chemical vapor deposition (SACVD) method were formed upon each of the five silicon semiconductor substrates time period of about 180 seconds.

The thicknesses of the five gap filling silicon oxide layers formed through the ozone assisted sub-atmospheric pressure chemical vapor deposition (SACVD) method were then measured through techniques as are conventional in the art. The measured values of the thicknesses of the five gap filling silicon oxide layers formed through the ozone assisted sub-atmospheric pressure chemical vapor deposition (SACVD) method were then normalized to formation rates of the five gap filling silicon oxide layers formed through the ozone assisted sub-atmospheric pressure chemical vapor deposition (SACVD) method. The formation rates are reported in Table I.

TABLE I

| Example | Underlayer | 03-TEOS Layer Formation Rate |
| --- | --- | --- |
| 1 | thermally grown silicon oxide | 120 angstroms/min. |
| 2 | thermal CVD silicon nitride | 1250 |
| 3 | LPCVD polysilicon | 1540 |
| 4 | LPCVD amorphous silicon | 1520 |
| 5 | silicon semiconductor substrate | 1550 |

From review of the data in Table I it is seen that there exists a substantial difference in formation rates for gap filling silicon oxide layers formed through the ozone assisted sub-atmospheric pressure chemical vapor deposition (SACVD) method upon the various integrated circuit layers or upon a silicon semiconductor substrate within Examples 1–5. In particular, the low formation rate for the gap filling silicon oxide layer formed through the ozone assisted sub-atmospheric pressure chemical vapor deposition (CVD) method upon the thermal silicon oxide layer makes it difficult to form a planarized gap filling silicon oxide trench fill layer from that gap filling silicon oxide layer when employed as a gap filling silicon oxide trench fill layer within a trench.

EXAMPLES 6–8

Semiconductor substrates fabricated in accord with either example 3 or example 4, as above, were annealed through a thermal annealing method in either a nitrogen containing atmosphere or an oxygen containing atmosphere. When annealed in the nitrogen containing atmosphere, the thermal annealing method employed: (1) an annealing chamber pressure of about 760 torr; (2) an annealing temperature of about 1100 degrees centigrade; (3) a nitrogen flow rate of about 10 standard liters per minute (slm); and (4) an annealing time of about 30 minutes. Similarly, when annealed within the oxygen containing atmosphere the thermal annealing method employed: (1) an annealing chamber pressure of about 760 torr; (2) an annealing temperature of about 1100 degrees centigrade; (3) an oxygen flow rate of about 10 standard liters per minute (sccm); and (4) an annealing time of about 30 minutes.

Measurements of shrinkage of the contiguous thermally annealed polysilicon layer and the thermally annealed gap filling silicon oxide layer formed from the polysilicon layer having formed thereupon the gap filling silicon oxide layer employed within example 3 and the contiguous thermally annealed amorphous silicon layer and the thermally annealed gap filling silicon oxide layer formed from the amorphous silicon layer having formed thereupon the gap filling silicon oxide layer employed within example 4 were determined employing optical methods as are conventional in the art to measure integrated circuit layer thicknesses. For comparison purposes, there was also determined under equivalent thermal annealing conditions the shrinkage of a single silicon oxide layer formed through a plasma enhanced chemical vapor deposition (PECVD) method, as is conventional in the art of integrated circuit fabrication, without having formed therebeneath a silicon layer. The calculated shrinkage values are reported in table II.

TABLE II

| Example | I/C layer(s) | N2 Anneal Shrinkage | O2 Anneal Shrinkage |
|---|---|---|---|
| 7 | LPCVD polysi + O3-TEOS | 4.9% | 0.8% |
| 8 | LPCVD α-silicon + O3-TEOS | 5.2 | 1.5 |
| 9 | PECVD silicon oxide | 5.1 | 5.9 |

As is seen from review of the data in Table II, the bilayers incorporating the low pressure chemical vapor deposited (CVD) polysilicon layer or the low pressure chemical vapor deposited (LPCVD) amorphous silicon layer in conjunction with a gap filling silicon oxide layer formed through an ozone assisted sub-atmospheric pressure chemical vapor deposition (SACVD) method yielded comparatively little shrinkage upon thermal annealing within an oxygen containing atmosphere, thus providing thermally oxidized contiguous bilayers where there is limited stress formed therein. Presumably, the minimal shrinkage of these bilayers upon thermal annealing within the oxygen containing atmosphere derives from a thickness increase upon thermal annealing and oxidizing the silicon layer which compensates for a thickness decrease when thermal annealing and densifying the gap filling silicon oxide layer formed through the ozone assisted sub-atmospheric pressure chemical vapor deposition (SACVD) method. Such compensation is not presumably not observed when annealing the bilayers within a nitrogen containing atmosphere since although the gap filling silicon oxide layers formed through the ozone assisted sub-atmospheric pressure chemical vapor deposition (SACVD) method are still densified and provide a thickness decrease, neither the amorphous silicon layer nor the polysilicon layer formed through the low pressure chemical vapor deposition (LPCVD) method is presumably oxidized to provide a thickness increase. Due similarly to the absence of a silicon layer underlying the silicon oxide layer formed through the plasma enhanced chemical vapor deposition (PECVD) method within example 8, that silicon oxide layer exhibits substantial shrinkage when thermally annealed within either an oxygen containing atmosphere or a nitrogen containing atmosphere.

As is understood by a person skilled in the art, the preferred embodiment and examples of the method of the present invention are illustrative of the present invention rather than limiting of the present invention. Revisions and modifications may be made to methods, materials, structures and dimensions through which is practiced the preferred embodiment and examples of the method of the present invention while still providing embodiments and examples which are within the spirit and scope of the method of the present invention, as defined by the appended claims.

What is claimed is:

1. A method for filling a trench within a substrate comprising:
    providing a substrate, the substrate having a trench formed therein;
    forming over the substrate and within the trench a silicon layer, the silicon layer having an aperture formed therein where the silicon layer is formed within the trench;
    forming upon the silicon layer and filling the aperture a gap filling silicon oxide trench fill layer, the gap filling silicon oxide trench fill layer being formed through an ozone assisted sub-atmospheric pressure chemical vapor deposition (SACVD) method; and
    annealing thermally the substrate within an oxygen containing atmosphere to form within the trench an oxidized silicon layer from the silicon layer, the oxidized silicon layer being contiguous with a densified gap filling silicon oxide trench fill layer formed from the gap filling silicon oxide trench fill layer.

2. The method of claim 1 wherein the substrate is chosen from the group of substrates consisting of dielectric substrates, semiconductor substrates and conductor substrates.

3. The method of claim 1 wherein the substrate is a semiconductor substrate and the trench is an isolation trench.

4. The method of claim 1 wherein the width of the trench is greater than about 0.3 microns and the depth of the trench is from about 3000 to about 5000 angstroms.

5. The method of claim 1 wherein:
    the thickness of the silicon layer is from about 150 to about 250 angstroms; and
    the silicon layer is formed from a silicon material chosen from the group of silicon materials consisting of polycrystalline silicon materials and amorphous silicon materials.

6. The method of claim 1 wherein:
    the gap filling silicon oxide trench fill layer is formed employing tetra-ethyl-ortho-silicate (TEOS) as a silicon source material; and
    the gap filling silicon oxide trench fill layer is formed at an ozone:TEOS volume ratio of from about 10:1 to about 15:1.

7. The method of claim 1 wherein substrate is annealed thermally at a temperature of from about 1000 to about 1100 degrees centigrade for a time period of from about 60 to about 120 minutes.

8. The method of claim 7 wherein the oxygen containing atmosphere is provided by an oxygen flow rate of from about 8 to about 12 standard liters per minute (slm).

9. A method for forming and planarizing a trench fill layer within a trench within a substrate comprising:
    providing a substrate, the substrate having a trench formed therein;
    forming over the substrate and within the trench a silicon layer, the silicon layer having an aperture formed therein where the silicon layer is formed within the trench;
    forming upon the silicon layer and filling the aperture a gap filling silicon oxide trench fill layer, the gap filling silicon oxide trench fill layer being formed through an ozone assisted sub-atmospheric chemical vapor deposition (SACVD) method;
    annealing thermally the substrate within an oxygen containing atmosphere to form within the trench an oxidized silicon layer from the silicon layer, the oxidized silicon layer being contiguous with a densified gap filling silicon oxide trench fill layer formed from the gap filling silicon oxide trench fill layer; and
    planarizing the oxidized silicon layer and the densified gap filling silicon oxide trench fill layer through a chemical mechanical polish (CMP) planarizing method.

10. The method of claim 9 wherein the substrate is chosen from the group of substrates consisting of dielectric substrates, semiconductor substrates and conductor substrates.

11. The method of claim 9 wherein the substrate is a semiconductor substrate and the trench is an isolation trench.

12. The method of claim 9 wherein the width of the trench is greater than about 0.3 microns and the depth of the trench is from about 3000 to about 5000 angstroms.

13. The method of claim 9 wherein:

the thickness of the silicon layer is from about 150 to about 250 angstroms; and the silicon layer is formed from a silicon material chosen from the group of silicon materials consisting of polycrystalline silicon materials and amorphous silicon materials.

14. The method of claim 9 wherein:

the gap filling silicon oxide trench fill layer is formed employing tetra-ethyl-ortho-silicate (TEOS) as a silicon source material; and the gap filling silicon oxide trench fill layer is formed at an ozone:TEOS volume ratio of from about 10:1 to about 15:1.

15. The method of claim 9 wherein substrate is annealed at a temperature of from about 1000 to about 1100 degrees centigrade for a time period of from about 60 to about 120 minutes.

16. The method of claim 14 wherein the oxygen containing atmosphere is provided by an oxygen flow at a rate of from about 8 to about 12 standard liters per minute (slm).

* * * * *